(12) United States Patent
Bernds et al.

(10) Patent No.: US 6,960,489 B2
(45) Date of Patent: Nov. 1, 2005

(54) METHOD FOR STRUCTURING AN OFET

(75) Inventors: Adolf Bernds, Baiersdorf (DE); Wolfgang Clemens, Puschendorf (DE); Walter Fix, Fürth (DE); Henning Rost, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/362,932

(22) PCT Filed: Aug. 29, 2001

(86) PCT No.: PCT/DE01/03318

§ 371 (c)(1),
(2), (4) Date: Feb. 27, 2003

(87) PCT Pub. No.: WO02/19443

PCT Pub. Date: Mar. 7, 2002

(65) Prior Publication Data

US 2003/0183817 A1 Oct. 2, 2003

(30) Foreign Application Priority Data

Sep. 1, 2000 (DE) .......................... 100 43 204

(51) Int. Cl.[7] .......................... H01L 51/40; H01L 35/24
(52) U.S. Cl. .......................... 438/99; 438/82; 438/142; 438/151; 438/197; 257/40
(58) Field of Search .......................... 438/82, 99, 142, 438/149, 151, 154, 197; 257/40, 411, 412, 410

(56) References Cited

U.S. PATENT DOCUMENTS

| | | |
|---|---|---|
| 3,769,096 A | 10/1973 | Ashkin |
| 4,340,657 A | 7/1982 | Rowe |
| 4,937,119 A | 6/1990 | Nikles et al. |
| 5,206,525 A | 4/1993 | Yamamoto et al. |
| 5,321,240 A | 6/1994 | Takahira |
| 5,347,144 A | 9/1994 | Garnier et al. |
| 5,364,735 A | 11/1994 | Akamatsu et al. |
| 5,480,839 A | 1/1996 | Ezawa et al. |
| 5,574,291 A | 11/1996 | Dodabalapur et al. |

(Continued)

FOREIGN PATENT DOCUMENTS

| | | |
|---|---|---|
| DE | 4243832 | 6/1994 |
| DE | 198 52312 | 5/1999 |
| DE | 198 16 860 | 11/1999 |
| DE | 198 51 703 | 5/2000 |
| DE | 199 21024 | 11/2000 |
| DE | 695 19782 | 1/2001 |
| DE | 10033112 | 1/2002 |
| DE | 10043204 | 4/2002 |
| DE | 100 06257 | 6/2002 |
| DE | 10061297 | 6/2002 |

(Continued)

OTHER PUBLICATIONS

Xiang–Yang Zheng, "Electrochemical Patterning of the Surface of Insulators with Electrically Conductive Polymers", J. Electrochem. Soc.,vol. 142, No. 12, Dec. 1995, pp226–227.*
U.S. Appl. No. 10/344,951, Adolf Bernds et al.
U.S. Appl. No. 10./362,932, filed Oct. 2, 2003, Adolf Bernds et al.

(Continued)

*Primary Examiner*—Donghee Kang
(74) *Attorney, Agent, or Firm*—Carella, Byrne et al.; Elliot M. Olstein; William Squire

(57) ABSTRACT

The invention relates to an organic field effect transistor, a method for structuring an OFET and an integrated circuit with improved structuring of the functional polymer layers. Structuring is achieved by scraping the functional polymer into a mold layer in which recesses are initially produced by exposure.

16 Claims, 2 Drawing Sheets

U.S. PATENT DOCUMENTS

| | | |
|---|---|---|
| 5,578,513 A | 11/1996 | Maegawa |
| 5,625,199 A | 4/1997 | Baumbach et al. |
| 5,652,645 A | 7/1997 | Jain |
| 5,691,089 A | 11/1997 | Smayling |
| 5,705,826 A | 1/1998 | Aratani et al. |
| 5,854,139 A | 12/1998 | Aratani et al. |
| 5,883,397 A | 3/1999 | Isoda et al. |
| 5,967,048 A | 10/1999 | Fromson et al. |
| 5,970,318 A | 10/1999 | Choi et al. |
| 5,973,598 A | 10/1999 | Beigel |
| 5,997,817 A | 12/1999 | Crismore et al. |
| 5,998,805 A | 12/1999 | Shi et al. |
| 6,036,919 A | 3/2000 | Thym et al. |
| 6,045,977 A | 4/2000 | Chandross et al. |
| 6,072,716 A | 6/2000 | Jacobson et al. |
| 6,083,104 A | 7/2000 | Choi |
| 6,087,196 A | 7/2000 | Sturm et al. |
| 6,133,835 A | 10/2000 | De Leeuw et al. |
| 6,150,668 A | 11/2000 | Bao et al. |
| 6,197,663 B1 | 3/2001 | Chandross et al. |
| 6,207,472 B1 | 3/2001 | Callegari et al. |
| 6,215,130 B1 | 4/2001 | Dodabalapur |
| 6,221,553 B1 | 4/2001 | Wolk et al. |
| 6,251,513 B1 | 6/2001 | Hyatt et al. |
| 6,284,562 B1 | 9/2001 | Batlogg et al. |
| 6,300,141 B1 | 10/2001 | Segal et al. |
| 6,321,571 B1 * | 11/2001 | Themont et al. ............... 65/155 |
| 6,329,226 B1 | 12/2001 | Jones et al. |
| 6,330,464 B1 | 12/2001 | Colvin, Jr. et al. |
| 6,335,539 B1 | 1/2002 | Dimitrakopoulos et al. |
| 6,340,822 B1 | 1/2002 | Brown et al. |
| 6,362,509 B1 | 3/2002 | Hart |
| 6,384,804 B1 | 5/2002 | Dodabalapur et al. |
| 6,403,396 B1 | 6/2002 | Gudesen et al. |
| 6,429,450 B1 | 8/2002 | Mutsaers et al. |
| 6,498,114 B1 | 12/2002 | Amundson et al. |
| 6,555,840 B1 | 4/2003 | Hudson et al. |
| 6,593,690 B1 | 7/2003 | McCormick et al. |
| 6,603,139 B1 | 8/2003 | Tessler et al. |
| 6,621,098 B1 | 9/2003 | Jackson et al. |
| 6,852,583 B2 | 2/2005 | Bernds et al. |
| 2002/0022284 A1 | 2/2002 | Heeger et al. |
| 2002/0025391 A1 | 2/2002 | Angelopoulos |
| 2002/0053320 A1 | 5/2002 | Duthaler |
| 2004/0026689 A1 | 2/2004 | Bernds et al. |
| 2004/0084670 A1 | 5/2004 | Tripsas et al. |

FOREIGN PATENT DOCUMENTS

| | | |
|---|---|---|
| DE | 19851703 | 5/2003 |
| DE | 102 19905 | 12/2003 |
| EP | 0 108650 | 5/1984 |
| EP | 0 418504 | 3/1991 |
| EP | 0 442123 | 8/1991 |
| EP | 0460242 | 12/1991 |
| EP | 0501456 A2 | 9/1992 |
| EP | 0501456 A3 | 9/1992 |
| EP | 0 511807 | 11/1992 |
| EP | 0685985 | 12/1995 |
| EP | 0716458 | 6/1996 |
| EP | 0 786820 | 7/1997 |
| EP | 0962984 | 12/1999 |
| EP | 0966182 | 12/1999 |
| EP | 0 979715 | 2/2000 |
| EP | 0989614 A2 | 3/2000 |
| EP | 1 048 912 | 11/2000 |
| EP | 1065725 A3 | 1/2001 |
| EP | 1065725 A2 | 1/2001 |
| EP | 1 103916 | 5/2001 |
| EP | 1103916 | 5/2001 |
| EP | 1224999 | 7/2002 |
| EP | 1237207 | 9/2002 |
| JP | 60117769 | 6/1985 |
| JP | 61001060 | 1/1986 |
| JP | 362065477 A | 3/1987 |
| JP | 01169942 | 7/1989 |
| JP | 08197788 | 8/1995 |
| WO | WO 93 16491 | 8/1993 |
| WO | WO 94/17556 | 8/1994 |
| WO | WO 953181 | 11/1995 |
| WO | WO 9602924 | 2/1996 |
| WO | 97/18944 | 5/1997 |
| WO | WO 97/18944 | 5/1997 |
| WO | WO 98 18156 | 4/1998 |
| WO | WO 9818156 | 4/1998 |
| WO | WO 98 18186 | 4/1998 |
| WO | WO 9840930 | 9/1998 |
| WO | WO 99/07189 | 2/1999 |
| WO | WO 99 10929 | 3/1999 |
| WO | 99/10939 | 3/1999 |
| WO | WO 99 10939 | 3/1999 |
| WO | WO 99 21233 | 4/1999 |
| WO | WO 99 30432 | 6/1999 |
| WO | WO 9930432 | 6/1999 |
| WO | WO 99 39373 | 8/1999 |
| WO | WO 99 40631 | 8/1999 |
| WO | WO 99 54936 | 10/1999 |
| WO | WO 00/36666 | 6/2000 |
| WO | WO 01 08241 | 2/2001 |
| WO | WO 01 15233 | 3/2001 |
| WO | WO 01 17041 | 3/2001 |
| WO | WO 0127998 | 4/2001 |
| WO | WO 0147044 A3 | 6/2001 |
| WO | WO 0147044 A2 | 6/2001 |
| WO | WO 0173109 A3 | 10/2001 |
| WO | WO 01 73109 A2 | 10/2001 |
| WO | WO 02095805 A2 | 11/2001 |
| WO | WO 02 05361 | 1/2002 |
| WO | WO 02 19443 | 3/2002 |
| WO | WO 02/47183 | 6/2002 |
| WO | WO 02 47183 | 6/2002 |
| WO | WO 02095805 A3 | 11/2002 |
| WO | WO 02 099907 | 12/2002 |
| WO | WO 04 042837 | 5/2004 |
| WO | WO 00 79617 | 12/2004 |

OTHER PUBLICATIONS

U.S. Appl. No. 10/380,113, filed Sep. 25, 2003, Adolf Bernds et al.
U.S. Appl. No. 10/380,206, Adolf Bernds et al.
U.S. Appl. No. 10/381,032, Adolf Bernds et al.
U.S. Appl. No. 10/433,959, Adolf Bernds et al.
U.S. Appl. No. 10/433,961, Wolfgang Clemens et al.
U.S. Appl. No. 10/451,108, Mark Giles et al.
U.S. Appl. No. 10/467,636, Adolf Bernds et al.
U.S. Appl. No. 10/473,050, Adolf Bernds et al.
U.S. Appl. No. 10/479,234, filed Dec. 30, 2004, Adolf Bernds et al.
U.S. Appl. No. 10/479,238, Adolf Bernds et al.
U.S. Appl. No. 10/492,922, Erwann Bullet et al.
U.S. Appl. No. 10/492,923, filed Dec. 23, 2004, Wolfgang Clemens et al.
U.S. Appl. No. 10/498,610, Walter Fix et al.
U.S. Appl. No. 10/508,640, Walter Fix et al.
U.S. Appl. No. 10/508,737, Adolf Bernds et al.
U.S. Appl. No. 10/517,750, Wolfgang Clemens et al.
U.S. Appl. No. 10/523,216, Adolf Bernds et al.
U.S. Appl. No. 10/523,487, Wolfgang Clemens et al.

U.S. Appl. No. 10/524,646, Walter Fix et al.
EP 1237207 filed Sep. 4, 2002, Fuji Photo Film Co.
GR2001P0329 (not available).
GR2001P20024 (not available).
Harsanyi G. et al., "Polytronics for biogtronics:unique possibilities of polymers in biosensors and BioMEMS", IEEE Polytronic 2002 Conference, Jun. 23, 2002, pp. 211–215.
Rogers J A et al:, "Low–Voltage 0.1 Mum Organic Transistors and Complementary Inverter Circuits Fabricated with a Low–Cost Form of Near–Field Photolithography", Applied Physics Letters, American Institute of Physics. New York, US, Bd. 75, Nr. 7, Aug. 16, 1999, Seiten 1010–1012, XP000934355, ISSN: 003–6951, das ganze Dokument.
Rogers, J. A. et al:, "Printing Process Suitable for Real–to–Real Production of High–Performance Organic Transistors and Circuits", Advanced Materials, VCH, Verlagsgeselischaft, Weinheim, DE, Bd. 11, Nr. 9, Jul. 5, 1999, Seiten 741–745, P000851834, ISSN: 0935–9648, das ganze Dokument.
Fraunhofer Magazin, "Polytronic: Chips voon der Rolle", Nr. 4, 2001, pp. 8–13.
deLeeuw, D.M. et al., "Polymeric integrated Circuits and Light–Emitting Diodes", IEEE 1997, pp. 331–337.
Oelkrug, D. et al., "Electronic spectra of self–organized oligothiophene films with 'standing' and 'lying' molecular units", Elsevier Science S.A., 1996, Thin Solid Films 284–270.
Sandberg, H. et al, "Ultra–thin Organic Films for Field Effect Transistors", SPIE vol. 4466, 2001, pp. 35–43.
Chen, X.L. et al., "Morphological and Transistor Studies of Organic Moleclar Semiconductors with Anisotropic Electrical Characteristics", American Chemical Society, 2001, Chem. Mater. 2001, 13, 1341–1348.
Schrodner, S. et al., "Plastic Electronics Based on Semiconducting Polymers", Session 4: Polymer Electronic Devices II, pp. 91–94.
Lowe, J. et al., "Poly(3(2–acetoxyethyl)thiophene): A model polymer for acid–catalyzed lithography", Elsevier Science S.A., 1997, Synthetic Metals 85 pp. 1427–1430.
Ullman et al., "High Performance Organic Field–Effect Transistors . . . ", Mat.Res.Soc. Symp. Proc. vol. 665, pp. 265–270.
Ficker, J. et al., "Dynamic and lifetime measurements of polymer . . . ", SPIE vol. 4466, 2001, pp. 95–102.
U.S. Appl. No. 10/332,140, Method for the Production and Configuration of Organic Field–Effect Transistors (OFET), Adolf Bernds et al.
U.S. Appl. No. 10/344/951, Organic Field–Effect Transistor (OFET), A Production Method Therefor, An Integrated Circuit Constructed From the Same and Their Uses, Adolf Bernds et al.
U.S. Appl. No. 10/362,932, Organic Field Effect Transistor, Method for Structuring on OFET and Integrated Circuit, Adolf Bernds et al.
U.S. Appl. No. 10/380,113, Organic Rectifier, Circuit, RFID Tag and Use of an Organic Rectifier, Adolf Bernds et al.
U.S. Appl. No. 10/380,206, Organic Memory, Identification Marker (RFID–TAG) with Organic Memory and Uses of an Organic Memory, Adolf Bernds et al.
U.S. Appl. No. 10/381,032, Electrode and/or Conductor Track for Organic Components and Production Method Thereof, Adolf Bernds et al.

U.S. Appl. No. 10/433,959, Organic Field Effect Transistor, Method For Structuring an OFET and Integrated Circuit, Adolf Bernds.
U.S. Appl. No. 10/433,961, Device For Detecting and/or Transmitting at Least One Environmental Influence, Method for Producing Said Device and Use Thereof, Wolfgang Clemens et al.
U.S. Appl. No. 10/467,636, Organic Field Effect Transistor With a Photostructured Gate Dielectric, Method for the Production and Use Thereof in Organic Electronics, Adolf Bernds et al.
U.S. Appl. No. 10/473,050, Device With At Least Two Organic Electronic Components and Method for Producing the Same, Adolf Bernds et al.
U.S. Appl. No. 10/479,238, Method For Producing Conductive Structures by Means of Printing Technique, and Active Components Produced Therefrom For Integrated Circuits, Adolf Bernds et al.
U.S. Appl. No. 10/492,922, Insulator for An Organic Electronic Component, Erwann Guillet et al.
U.S. Appl. No. 10/492,923, Electronic Unit, Circuit Design for the Same and Production Method, Wolfgang Clemens et al.
U.S. Appl. No. 10/498,610, Organic Field Effect Transistor with Offset Threshold Voltage and the Use Thereof, Walter Fix et al.
Garnier F et al:, "Vertical Devices Architecture By Molding Of Organic–Based Thin Film Transistor", Applied Physics Letters, American Institute Of Physics. XP000784120, issn: 0003–6951 abbildung 2.
Collet J. et al:, Low Voltage, 30 NM Channel Length, Organic Transistors with a Self–Assembled Monolayer as Gate Insulating Films:, Applied Physics Letters, American Institute of Physics. New York, US, Bd 76, Nr. 14, Apr. 3, 2000, Seiten 1941–1943, XP000950589, ISSN:0003–6951, das ganze Dokument.
Hwang J D et al:, "A Vertical Submicron Sic thin film transistor", Solid State Electronics, Elsevier Science Publishers, Banking, GB, Bd. 38, NR. 2, Feb. 1, 1995, Seiten 275–278, XP004014040.
Bao, Z. et al., "Organic and Polymeric Materials for the Fabrications of Thin Film Field–Effect Transistors", paper presented at the meeting of American Chemical Society, Division of Polymer Chemistry, XX, XX, Bd. 39, Nr. 1, Mar. 29, 1998, P001032497, ISSN: 0032–3934 das ganze Dokument.
"Short–Channel Field–Effect Transistor", IBM Technical Disclosure Bulletin, IBM Corp., New York, US, Bd. 32, Nr. 3A, Aug. 1, 1989, Seiten 77–78, XP000049357, ISSN:0018–8689, das ganze Dokument.
Redecker, M. et al., "Mobility enhancement through homogeneous nematic alignment of a liquid–crystalline polyfluorene", 1999 American Institute of Physics, Applied Physics Letters, vol. 74, No. 10, pp. 1400–1402.
Miyamoto, Shoichi et al:, Effect of LDD Structure and Channel Poly–Si Thinning on a Gate–All–Around TFT (GAT) for SRAM's, IEEE Transactions on Electron Devices. vol. 46, No. 8, Aug. 1999.
Kumar, Anish et al:, "Kink–Free Polycrystalline Silicon Double–Gate Elevated–Channel Thin–Film Transistors", IEEE Transactions on Electron Devices, vol. 45, No. 12, Dec. 1998.-

Chen, Shlao-Shien et al:, "Deep Submicrometer Double-Gate Fully-Depleted SOI PMOS Devices: A Concise Short-Channel Effect Threshold Voltage Model Using a Quasi-2D Approadh", IEEE Transaction on Electron Devices, vol. 43, No. 9, Sep. 1996.

Zangara L. "Metall Statt Halbleiter, Programmierung Von Embedded ROMS Ueber Die Metallislerungen", Elektronik, Franzis Verlag GMBH, Munchen, DE, Bd. 47, Nr. 16, Aug. 4, 1998, Seiten 52–55, XP00847917, ISSN: 0013–5658, Seite 52, rechtes Plate, Zeile 7–Seite 53, linke Spalte, Zeile 14; Abbildungen 1, 2.

Hergel, H. J.: "Pid–Programmiertechnologien", Elektronik, Franzis Verlag GMBH. Munchen, DE, Bd 41, Nr. 5, Mar. 3, 1992, Seiten 44–46, XP000293121, ISSN: 0013–5658, Abblidungen 1–3.

Forrest et al.: "The Dawn of Organic Electronics", IEEE Spectrum, Aug. 2000, Seiten 29–34, XP002189000, IEEE Inc., New York, US ISSN:0018–9235, Seite 33, rechte Spalte, Zelle 58–Seite 34, linke Spalte, Zelle 24; Abbildung 5.

Zie Voor Titel Boek, de 2e Pagina, XP–002189001, PG 196–228.

Klauk, H. et al., "Fast Organic Thin Film Transistor Circuits", IEEE Electron Device Letters, vol. 20, No. 6, pp. 289–291.

Kuhlmann et al., "Terabytes in Plastikfolie", Organische Massenspeicher vor der Serienproduktion.

Garnier, F. et al, "All–Polymer Field–Effect Transistor Realized by Printing Techniques", Science, American Association for the Advancement of Science, US, vol. 265, Sep. 16, 1994, pp. 1684–1686.

Assadi A, et al:, Field–Effect Mobility of Poly (3–Hexylthiophene) Dept. of Physics and Measurement Technology, Received Mar. 3, 1988; accepted for Publication May 17, 1988.

Drury, C. J. et al., "Low–cost all–polymer integrated circuits", Applied Physics Letters, vol. 73, No. 1, Jul. 6, 1988, pp 108–110.

Roman et al., Polymer Diodes with High Rectification:, Applied Physics Letters, vol. 75, No. 21, Nov. 22, 1999.

Schoebel, "Frequency Conversion with Organic–On–Inorganic Heterostructured Diodes", Extended Abstracts of the International Conference on Solid State Devices and Materials, Sep. 1, 1997.

Lucent Technologies, "Innovation marks significant milestone in the development of electronic paper", Cambridge, MA and Murray Hill, NJ, Nov. 20, 2000. XP–002209726.

Gelinck, G.H. et al., "High–Performance All–Polymer Integrated Circuits", Applied Physics Letters, v. 77, 2000, pp. 1487–1489.

Garnier et al., "Conjugated Polymers and Oligomers as Active Material For Electronic Devices", Synthetic Metals, vol. 28, 1989.

Crone, B. et al., "Large–scale complementary integrated circuits based on Organic transistors", Nature, vol. 403, Feb. 3, 2000, pp. 521–.

Dodabalapur, A. et al., Organic smart pixels, American Institute of Physics, Applied Physics Letters, vol. 73, No. 2, Jul. 13, 1998, pp. 142–144.

Halls, J.J. M., et al., "Efficient photodiodes from interpenetrating polymer networks", Nature, vol. 376, Aug. 10, 1995, pp. 498–500.

Brown, A.R. et al., "Field–effect transistors made from solution–processed organic semiconductors", Elsevier Science, S.A., Synthetic Metals 88 (1997) pp. 37–55.

Brown, A.R., "Logic Gates Made from Polymer Transistors and Their Use in Ring Oscillators", Science, vol. 270, Nov. 10, 1995, pp 972–974.

Klauk, H. et al., "Pentacene Thin Film Transistors and Inverter Circuits", 1997 International Electron Devices Meeting Technical Digest, pp. 539–542, Dec. 1997.

Rogers J A et al. "Printing Process Suitable for Reel-To-Reel Production of High–Performance Organic Transistors and Circuits", Advanced materials, VCH Verlagsgesellschaft, Weinheim, DE, vol. 11, No. 9, Jul. 5, 1999, pp. 741–745, XP000851834, ISSN: 0935–9648.

Rogers J A et al., "Low–Voltage 0.1 Mum Organic Transistors and Complementary Inverter Circuits Fabricated with a Low–Cost Form of Near–Field Photolithography", Applied Physics Letters, American Institute of Physics, New York, US, vol. 75, No. 7, Aug. 16, 1999, pp. 1010–1012, XP000827671, ISSN; 0003–6951.

C.J. Drury et al., "Low–Cost All–Polymer Integrated Circuits," Applied Physics Letters, V. 73, 1998, pp. 108–110.

D.G. Lidzey et al., "Photoprocessed and Micropatterned Conjugated Polymer LEDs," Synthetic Metals, V. 82, 1996, pp. 141–148.

Xiang–Yang Zheng et al., "Electrochemical Patterning of the Surface of Insulators with Electrically Conductive Polymers," J. Electrochem. Soc., V. 142, 1995, pp. L226–L227.

W. Kobel et al., "Generation of Micropatterns in Poly(3–Methyl–Thiophene) Films Using Microlithography: A First Step in the Design of an All–Organic Thin–Film Transistor," Synthetic Metals, V. 22, 1988, pp. 265–271.

Henning Rost et al., "All–Polymer Organic Fieldeffect–Transistors," Proc. Mat. Week, CD, 2001, pp. 1–6.

Alessandro Manuelli et al., "Applicability of Coating Techniques for the Production of Organic Field Effect Transistors," IEEE Polytronic 2002 Conference, 2002, pp. 201–204.

A. Ullmann et al., "High Performance Organic Field–Effect Transistors and Integrated Inverters," Mat. Res. Soc. Symp. Proc., V. 665, 2001, pp. 265–270.

W. Fix et al., "Fast Polymer Integrated Circuits Based on a Polyfluorene Derivative," ESSDERC 2002, 2002, pp. 527–529.

Alexander Knobloch et al., "Printed Polymer Transistors," Proc. Polytronic, V. 84, 2001, pp. 84–89.

Jürgen Ficker et al., "Dynamic and Lifetime Measurements of Polymer OFETs and Integrated Plastic Circuits," Proc. of SPIE, V. 466, 2001, pp. 95–102.

Wolfgang Clements et al., "Vom Organischen Transistor Zum Plastik–Chip," Physik Journal, V. 2, 2003, pp. 31–36.

W. Fix et al., "Fast Polymer Integrated Circuits," Applied Physics Letters, V. 81, pp. 1735–1737.

* cited by examiner

METHOD FOR STRUCTURING AN OFET

CROSS REFERENCE TO RELATED APPLICATIONS

This is the 35 USC 371 national stage application PCT/DE01/03318 filed on Aug. 29, 2002, which designated the United States of America.

FIELD OF THE INVENTION

The invention relates to an organic field effect transistor, a method for structuring an OFET and an integrated circuit with improved structuring of the functional polymer layers.

BACKGROUND OF THE INVENTION

Integrated plastic circuits based on OFETs are used for microelectronic mass applications and disposable products such as identification and product tags. A tag is, for example, an electronic bar code of the kind provided on merchandise or on luggage. OFETs have a wide range of uses as RFID tags: radio frequency identification tags, which need not be arranged only on the surface. In the case of OFETs for these applications, the excellent operating behavior of silicon technology can be dispensed with, but by the same token low production costs and mechanical flexibility should be ensured. The components, such as, for example, electronic bar codes, are typically disposable products and of interest economically only if they are produced in economical processes.

To date, owing to the production costs, only the conductor layer of the OFET has been structured. Structuring can only be realized using a two-stage process ("lithography method", cf. in this respect Applied Physics Letters 73(1), 1998, p. 108.110 and Mol. Cryst. Liq. Cryst. 189, 1990, p. 221–225) with firstly uniform exposure and subsequent structuring, which moreover is material-specific. "Material specificity" means that the process described, with the photochemical components mentioned, only function on the conductive organic material polyaniline. A different conductive organic material, e.g. polypyrrole, cannot readily be structured in this way.

The lack of structuring of the other layers, such as at least the structuring of semiconducting and of the insulating layer comprising functional polymers (which may be present in polymeric or oligomeric form), leads to a substantial reduction in performance of the OFETs obtained, but it is dispensed with for cost reasons. The structured layer can be structured by other known methods (such as, for example, printing) only in such a way that the length l, which denotes the distance between source and drain electrodes and is therefore a measure of the power density of the OFET, is at least 30 to 50 $\mu$m. However, lengths l of less than 10 $\mu$m are desirable, and hence at present no structuring method apart from the complicated lithography method appears reasonable.

SUMMARY OF THE INVENTION

It was therefore an object of the invention to provide a cost-effective method for structuring OFETs with high resolution which is suitable for mass-production. Furthermore, it is an object of the invention to provide an OFET which is more powerful, because it is equipped with more structured layers, and which is more compact and can be produced with a smaller distance l.

The invention relates to an organic field effect transistor (OFET), comprising at least the following layers on a substrate:

an organic semiconductor layer between and above at least one source electrode and at least one drain electrode which comprise a conductive organic material, an organic insulation layer above the semiconducting layer and an organic conductor layer, the conductor layer and at least one of the other two layers being structured. Moreover, the invention relates to a method for structuring an OFET by scraping at least one functional polymer into a negative mold.

Finally, the invention relates to an integrated circuit which comprises at least one OFET which has at least one structured conductor layer and a further structured layer.

Figure 1:
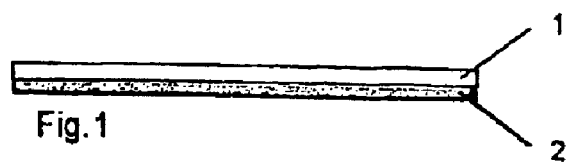
FIG. 1 is a side elevation sectional view of a substrate over which is a negative mold layer.

A negative mold is designed as a structured layer or a part of a structured layer which contains recesses into which functional polymers, which form, for example, an electrode of an OFET or a semiconductor layer or an insulator layer, is introduced by scraping.

The length l which describes the distance between source and drain electrode can be reduced to the order of magnitude of $\lambda$ (wavelength) of the incident light if the negative mold is structured by exposure to radiation. A preferred OFET is one which has a length l of less than 20 $\mu$m, in particular of less than 10 $\mu$m and very particularly of 2 to 5 $\mu$m or less.

DETAILED DESCRIPTION OF THE INVENTION

The method comprises the following operations:

a) an optionally whole-area mold layer, which need not be restricted to the region which is to be structured, is applied to a substrate or a lower layer; this mold layer is not the functional polymer (i.e. semiconducting, conductive or insulating layer) but another organic material which serves as a mold or block for the conductive organic electrode layer; this other organic material should have insulating properties;

b) by exposure through a mask, the mold layer acquires recesses which correspond to the structures;

c) the functional polymer is then scraped in liquid form, as a solution and/or as a melt into these recesses.

The negative mold of the structure on the mold layer can be produced by exposing a photoresist layer on the substrate or a lower layer. The material of the negative mold may be a photoresist which has recesses after exposure through a mask, such as, for example, a shadow mask, or another structuring method already described and subsequent development.

Resists suitable for this purpose are all commercially available and the methods for structuring them, for example, by exposure, are known from the literature.

The advantage of the doctor blade method consists in the fact that the difficult structuring of the functional polymer can be implemented by the established and proven photoresist method. It is thus possible to rely on the rich technical background, and extremely fine structures can be achieved. The doctor blade method is moreover not material-specific. Rather, polyaniline, but also any other conductive organic layer, e.g. polypyrrole, can be used for the production of electrodes by the doctor blade method. Any other organic material, such as, for example, polythiophene as a semiconductor and/or polyvinylphenol as an insulator, can likewise be structured thereby, i.e. the whole OFET.

In the multilayer structure of an OFET, one or more layers can be produced by the doctor blade method. In the case of a plurality of layers, the photoresist technique in the formation of the negative mold is preferred because, for example, the imprint method does not structure the mold layer over the whole layer thickness but leaves in the recesses a certain base which prevents electrical contact with the layer underneath. This plays no role for the first layer, e.g. source/drain electrodes, but does for all further layers.

Figure 8:
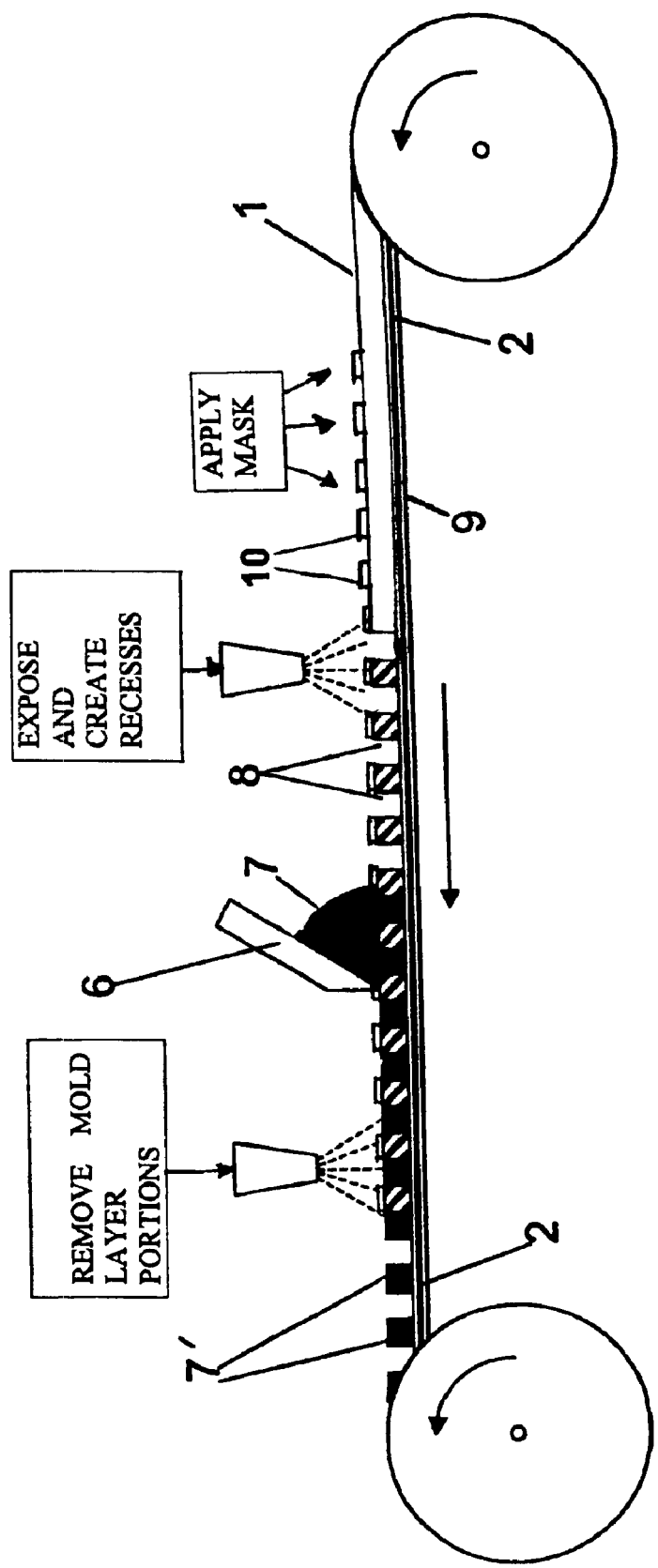
FIG. 8 is a diagrammatic side elevation view of a process using a moving belt for forming the product on the substrate.

According to a preferred embodiment of the method, FIG. 8, the method is operated continuously, i.e., a belt 9 with the mold layer 1. is transported past different stations in succession, where first recesses 8 are formed in the mold layer 1, by for example, exposure using a mask 10 applied to the mold layer 1. The recesses 8 are then filled at least once with functional polymer 7 by means of a doctor blade 6 at a doctor blade station further down the course. The mold layer portions and mask are then removed at the final station.

Another approach for avoiding a possible height difference between negative mold and functional polymer is to repeat the scraping process, with the result that the volume of the negative mold is simply further filled.

As a rule, the functional polymers can be substantially left in their optimum consistency. Thus, for example, polyaniline, a conductive organic material, has a certain viscosity at optimum conductivity. If polyaniline is to be printed, its viscosity must be adjusted to the value adapted to the printing method. This generally means adverse conductivity effects. The viscosity range for scraping is greater than that for printing, so that as a rule no viscosity changes need be made to the organic material.

Finally, an advantage of the scraping method is the ability to obtain thick layers. Thus, for example, the conductivity of 1 $\mu$m thick polmer electrodes is effectively higher than in the case of the usual 0.2 $\mu$m layer thickness. An OFET having a layer thickness in the range up to 1 $\mu$m, in particular in the range from 0.3 to 0.7 $\mu$m, is therefore advantageous.

According to a preferred embodiment of the method, it is operated continuously, i.e. a belt with the mold layer is transported past different stations in succession, where first recesses are formed in the mold layer by, for example, exposure using a mask and said recesses are then filled at least once with functional polymer by means of a doctor blade station in the further course.

Here, a "functional polymer" is defined as any organic, organometallic and/or inorganic material which is functionally involved in the production of an OFET and/or of an integrated circuit comprising a plurality of OFETs. These include, for example, a conductive component (e.g. polyaniline), which forms an electrode, the semiconducting component, which forms the layer between the electrodes, and the insulating component. It is expressly pointed out that the term "functional polymer" accordingly also includes nonpolymeric components, such as, for example, oligomeric compounds.

Here, "organic" summarizes everything which "is based on organic material", the term "organic material" including all types of organic, organometallic and/or inorganic synthetic materials which are referred to in English, for example, as "plastics". These comprise all types of substances with the exception of the classical semiconductors (germanium, silicon) and the typical metallic conductors. A restriction in the dogmatic sense to organic materials as carbon-containing material is accordingly not intended, but the broad use of, for example, silicones is also envisaged. Furthermore, the term is not intended to be restricted to polymeric or oligomeric materials, but the use of "small molecules" is also entirely conceivable.

Here, "lower layer" is defined as any OFET layer to which a layer to be structured is applied. The mold layer comprising the mold polymer is adjacent to the "lower layer" or the substrate. Furthermore, the term "polymer" here does not specify a polymeric state of aggregation for the mold polymer, but this substance may also be any plastic which can be used in practice for the formation of a negative mold.

BRIEF DESCRIPTION OF THE DRAWINGS

An embodiment of the method is explained in more detail below with reference to schematic figures.

Figure 2:
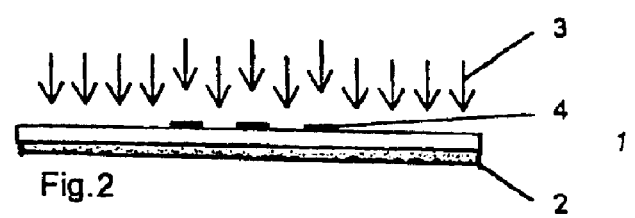
FIG. 2 is a side elevation sectional view of the substrate and mold layer of FIG. 1 with the mold layer being exposed through a shadow mask.
Figure 3:
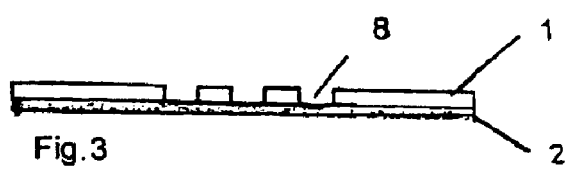
FIG. 3 is a side elevation sectional view of the substrate and mold layer of FIG. 2 with recesses formed in the mold layer.
Figure 4:
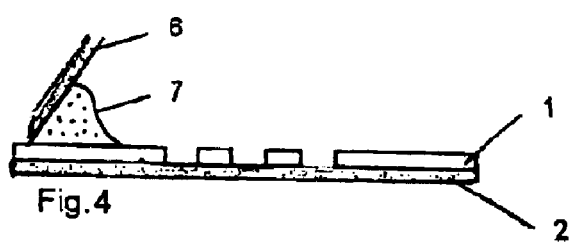
FIGS. 4 and 5 are side elevation sectional views of the substrate and mold layer of FIG. 3 wherein the recesses are shown being filled in with a functional polymer.
Figure 5:
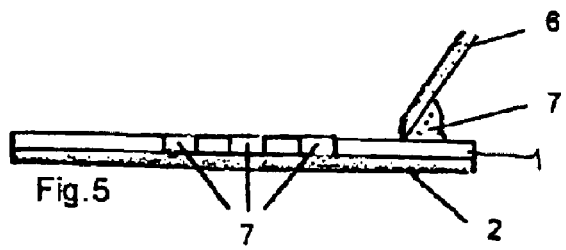
Figure 6:
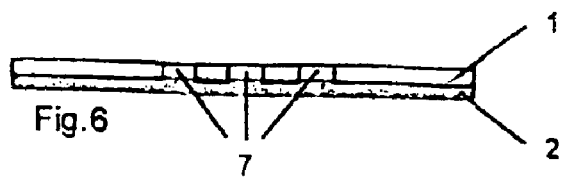
FIG. 6 is a side elevation sectional view that shows the filled recesses.
Figure 7:
FIG. 7 is a side elevation sectional view of the substrate and formed product on the substrate.

FIG. 1 shows the substrate or the lower layer 2 to which the mold layer of the negative mold 1, for example comprising a mold polymer, such as a photoresist, is applied over the whole surface. As shown in FIG. 2, the mold layer is exposed through a shadow mask 4 to, for example, UV radiation 3. This results in the formation of recesses S in the mold layer 1, as shown in FIG. 3. The functional polymer 7 is then scraped into these recesses by means of a doctor blade 6 (FIGS. 4 and 5). FIG. 6 shows how the functional polymer 7 fills the recesses 8 of the mold layer 1 in the prepared OFET. FIG. 7 shows the final product on the substrate. FIG. 8 shows an implementing conveyor apparatus for forming the product. Here the substrate lower layer 2 is on a moving belt 9 that moves in the direction of the arrow. The mask 4 is applied, the mold lower layer 2 is then exposed through the mask to form recesses 8, a doctor blade 6 then fills the recesses 8 with the polymer 7, the mold layer and mask portions are then removed leaving the product 7' on the belt.

What is claimed is:

1. A method for structuring an organic field effect transistor (OFET) comprising:
    forming a negative mold having at least one recess defining at least a portion of the OFET; and
    scraping at least one functional polymer into the at least one recess to thereby form said portion.

2. The method as claimed in claim 1, comprising the following operations:
    a) a mold layer for a negative mold is applied to a substrate or a lower layer,
    b) this mold layer acquires a plurality of said recesses which correspond to the negatives of the subsequent structures and
    c) the functional polymer is then scraped into these recesses.

3. The method as claimed in claim 2, in which the mold layer is removed after the structuring.

4. The method as claimed in claim 2, in which the functional polymer is scraped at least twice into the recesses of the mold layer.

5. The method as claimed in claim 2, in which the recesses in the mold layer are produced by irradiation using a mask.

6. The method as claimed in claim 2, which is carried out as a continuous method using a continuously moving belt.

7. The method as claimed in claim 1, in which the mold layer is removed after the structuring.

8. The method as claimed in claim 7, in which the functional polymer is scraped at least twice into the recesses of the mold layer.

9. The method as claimed in claim 7, in which the recesses in the mold layer are produced by irradiation using a mask.

10. The method as claimed in claim 7, which is carried out as a continuous method using a continuously moving belt.

11. The method as claimed in claim 1, in which the functional polymer is scraped at least twice into the recesses of the mold layer.

12. The method as claimed in claim 11, in which the recesses in the mold layer are produced by irradiation using a mask.

13. The method as claimed in claim 11, which is carried out as a continuous method using a continuously moving belt.

14. The method as claimed in claim 1, in which the recesses in the mold layer are produced by irradiation using a mask.

15. The method as claimed in claim 14, which is carried out as a continuous method using a continuously moving belt.

16. The method as claimed in claim 1, which is carried out as a continuous method using a continuously moving belt.

* * * * *